(12) United States Patent
Garibin et al.

(10) Patent No.: US 7,001,458 B2
(45) Date of Patent: Feb. 21, 2006

(54) PROCESS FOR GROWING OF OPTICAL FLUORITE SINGLE CRYSTALS

(75) Inventors: Evgeny A. Garibin, St. Petersburg (RU); Aleksey A. Demidenko, St. Petersburg (RU); Igor A. Mironov, St. Petersburg (RU); Gury T. Petrovsky, St. Petersburg (RU); Vladimir M. Reyterov, St. Petersburg (RU); Aleksandr N. Sinev, St. Petersburg (RU)

(73) Assignee: Corning Incorporated, Corning, NY (US)

( * ) Notice: Subject to any disclaimer, the term of this patent is extended or adjusted under 35 U.S.C. 154(b) by 368 days.

(21) Appl. No.: 10/423,991

(22) Filed: Apr. 25, 2003

(65) Prior Publication Data

US 2003/0221607 A1    Dec. 4, 2003

(30) Foreign Application Priority Data

May 31, 2002    (RU) .............................. 2002115061

(51) Int. Cl.
*C30B 11/14*    (2006.01)
(52) U.S. Cl. .............................. 117/81; 117/82; 117/83; 117/944
(58) Field of Classification Search .................. 117/81, 117/82, 83, 944
See application file for complete search history.

(56) References Cited

U.S. PATENT DOCUMENTS

2003/0012725 A1 *   1/2003   Gray et al. .................. 423/490
2003/0104318 A1 *   6/2003   Allan et al. ................. 430/311
2003/0160177 A1 *   8/2003   Mayolet et al. ............. 250/372
2003/0221610 A1 *  12/2003   Garibin et al. .............. 117/82
2005/0065049 A1 *   3/2005   Burdo et al. ................ 510/170

OTHER PUBLICATIONS

Web site www.canon-optron.co.jp/english/fluorite Optical crystal Products.*

* cited by examiner

*Primary Examiner*—Robert Kunemund
(74) *Attorney, Agent, or Firm*—Walter M. Douglas

(57) ABSTRACT

The present invention relates to the technical field of preparing artificial calcium fluoride (optical fluorite) single crystals by growing from a melt by the directed crystallization and by using a seed crystal. The aim of the invention is to obtain oriented single crystals with a small deviation from the given direction. The technical result is achieved by the selection of a concrete technological mode in which the leading role has a period for melting of seed crystal. The optical fluorite single crystals are grown by crystallization on the oriented seed inserted into the central part of a bottom of crucible. Before the beginning of crystallization the crucible with a melt is maintained in a melt zone for a time that is sufficient for the homogenization of the whole melt and in this time the bottom part of a seed crystal appears below a melt zone. Subsequently, the crucible with a melt and with a seed crystal is moved from the melt zone into the annealing zone with the given speed. The method differs from the prior art in that the crucible with a melt is kept in a melt zone for 24–48 hours, then the crucible is relocated upwards into the melt zone at a speed of 5–50 mm/hr to a level making 10–40% of the height of the seed crystal within the melt zone. The crucible is kept in such condition from 10 about 20 minutes, and then the crucible is moving downwards out of the melt zone in accordance to the given mode of crystallization.

8 Claims, 1 Drawing Sheet

PROCESS FOR GROWING OF OPTICAL FLUORITE SINGLE CRYSTALS

RELATED APPLICATION

This application claims the benefit of Russian Patent Application Number 2002115061, filed May 31, 2002, which is incorporated herein by reference in its entirety.

FIELD OF THE INVENTION

The present invention relates to the technical field of manufacture of calcium fluoride single crystals by growing from a melt by the directed crystallization and by using a seed crystal.

BACKGROUND OF THE INVENTION

Optical-grade fluorite crystals are grown industrially by directed crystallization by the Bridgeman-Stockbarger method, the basis of which is the moving of crucible containing the melt through a thermal field with specified gradient in high vacuum. A cylindrical container (crucible") containing the melt is moved from a hot zone to a colder zone. The crystal growth with an oriented seed is used to obtain the crystals with the necessary orientation. From a seed crystal, the crystal is increased gradually in size and occupies all volume of the container that allows growing crystals of given diameter.

One of the main conditions for the growth of quality homogeneous crystals is a constancy of temperature and its gradients in a crystallization zone. The instability of thermal conditions results in occurrence of defects in crystals. Vertical moving (e.g., from the top downward) of the container containing a crystallizing substance from a melt zone into an annealing zone and the smooth or gradual decreasing of temperature under conditions of a constant gradient in the temperature areas is more frequently applied. Thermal screens are used to create the necessary temperature gradients in crystallization zone. The zones are divided from each other with a diaphragm (also called a baffle), (See A. A. Chernov et al., "Sovremennaya kristallographiya" (=Modern crystallography), "Nauka", Moscow, 1980, V. 3, p. 350.)

Single crystals that have been grown from a melt can have various defects, including defects inherited from a seed crystal. The use of high quality seed crystals is the important condition of obtaining of perfect product crystals. Small diameter seed crystals of the same crystal material, obtained from the crystals that were grown in similar conditions during previous cycles, are usually used. The seed is placed so that a small area of the seed crystal is in the melting zone. The opportunity of obtaining of the perfect crystals from a melt by using the qualitative seed, which has as the growth face a crystal with high symmetry is proved experimentally.

Both radial and axial streams of heat are presented in a growing cylindrical crystal. The radial thermal stream connected with the cooling of an available single crystal, and the axial stream is connected with process of growth. Axial and radial gradients create the residual stress differing as in size and in sign. The initial front of crystallization, which depends on all above mentioned conditions and on other reasons, that accompanies such a delicate and complex physical process as crystallization is formed in a seed zone of melt.

The growth of single crystals by the Bridgeman-Stockbarger method, described in the book entitled "Rost monokristallov" (Growth of Crystals) by R. Lodiz and R. Parker, translated from English into Russian, edited by A. A. Chernov, "Mir", Moscow, 1974, pp. 181–183), is among the prior art of the present invention. The growth of single crystals in the apparatus, which has two isothermal regions with thermal drop between them is offered that allows annealing a crystal directly after growth without high thermal stress. The two temperature regions should have the minimal heat exchange. They are shared by thermal insulation and the independent temperature regulation in each zone is provided. The heat sink can be carried out from a bottom of the crucible by the use of a special high heat conduction rod, the other end of which is in a cold zone of the furnace or for its limits.

The prior art method of single crystal growth is applicable even for optical fluorite with the use of a seed crystal located inside the crucible with a melt, namely inserted into the central part of crucible at its bottom.

In the prior art, as well as in other sources of the information that are well known to those skilled in the art in the field of the present invention, the specific conditions of the technological process by which one can obtain high quality single crystals of a specific material of the certain sizes, in particular of large size crystals of optical fluorite, are not described. That is, the conditions for making large optical quality fluorite crystals is not known.

SUMMARY OF THE INVENTION

The authors of the present invention studied and reduced to practice various technological modes for growing calcium fluoride single crystals. In particular the process of seed formation from melt was especially investigated. It is noticed that presence of an oriented seed not always provides necessary orientation of the grown single crystals. The aim of the invention is the obtaining of oriented single crystals with a small deviation from the given direction.

The technical result is achieved by the selection of a concrete technological mode in which the leading role has the period of seed a melt.

DETAILED DESCRIPTION OF THE INVENTION

Figure 1:
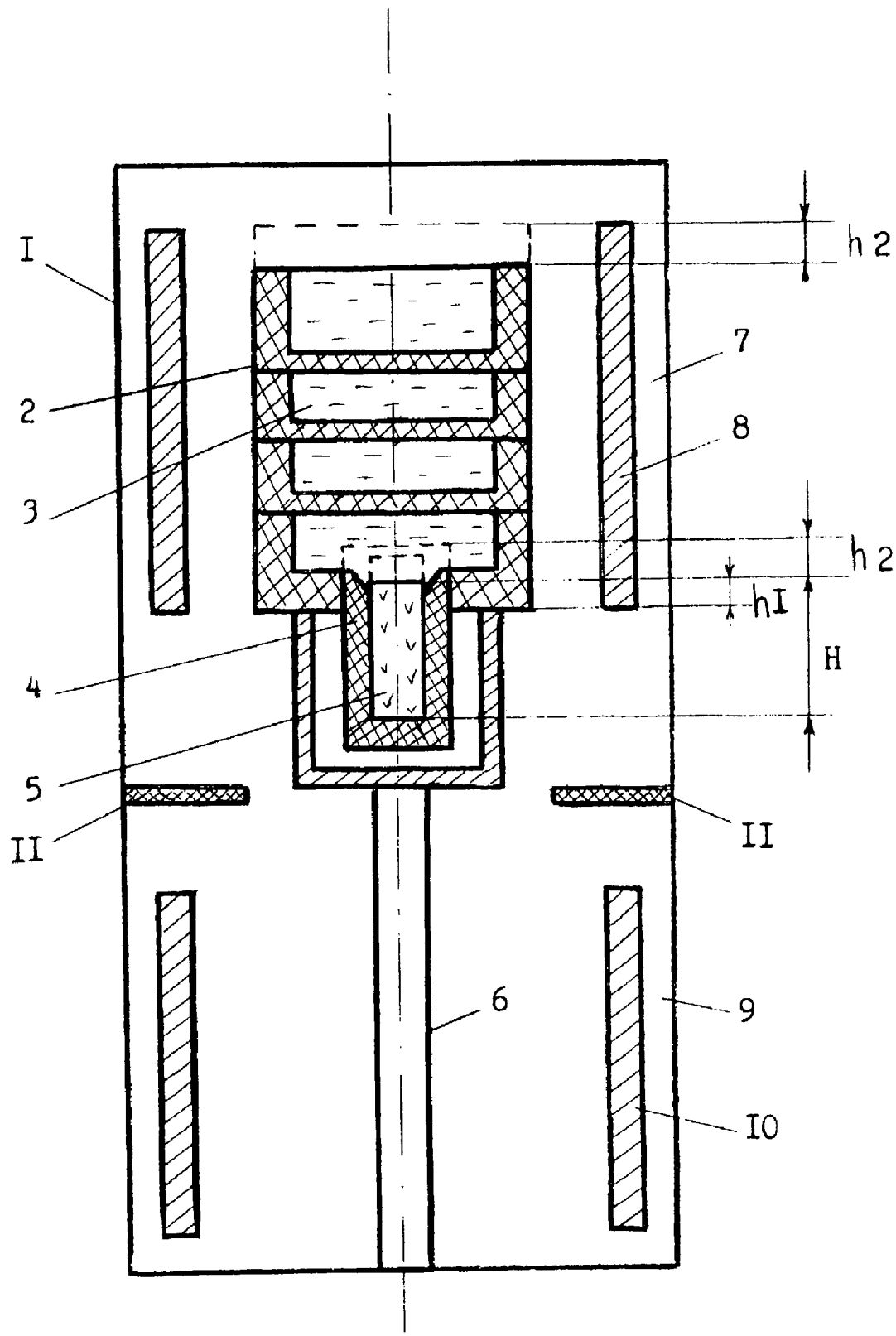
FIG. 1 illustrates a furnace used to prepare crystals in accordance with the invention.

The invention is to a process for the formation of high quality calcium fluorite (also called calcium fluoride) crystals. The task is described and the solution is presented as follows. The method of growing optical quality calcium fluoride single crystals includes crystallization on an oriented seed that is inserted into the central part of the bottom of crucible via movement of the crucible containing the melt and the seed crystal from the melt zone to the annealing zone at a given speed. Before the beginning of crystallization process, the crucible with a melt of calcium fluoride is maintained in a melt zone for a time that is sufficient for the homogenization of the whole melt. During this time the bottom part of a seed crystal is kept below the melt zone. The crucible with the melt and with the seed crystal is moved from a melt zone into the annealing zone with the given speed. The method differs form that of the prior art in that the crucible with a melt is kept in the melt zone for a period of within 24–48 hours, and then the crucible is relocated upwards at a speed 5–50 mm/hr to a level such that 10–40% of the height of the seed crystal. The crucible is kept in such condition from 10 to about 20 minutes, and then a crucible is moved downwards in accordance to the given mode of crystallization.

The holding of a melt in a melt zone within 24–48 hours is necessary for obtaining of homogeneity of the melt. The seed crystal is in position at which only about 10–30% of the top part of the seed length is melting. While holding the seed crystal in this position the temperature of the furnace stabilizes it when there is a large volume of melt. The melt-solid boundary makes an oscillatory movement relatively of crystallization border while being so held during the process holding. During this time the formation of a parasitic crystal nucleus is possible which may lead, during further crystallization, to the formation of a crystal with an orientation that is different from the initial orientation of the seed crystal. The short-term relocating upwards of the crucible with a speed 5–50 mm/hr on 10–14% from height of a seed crystal was selected by the experimental methods. It provides the safety of the initial seed orientation. Duration of crucible holding in such raised position is experimentally determined and the minimal time of holding to reach the effect is 10 minutes. Holding the crucible in the raised position for more than 20 minutes is not required and even result in the appearance of non-oriented nucleus of crystallization. The above described mode is chosen experimentally and provides growth of oriented optical fluorite single crystals.

The submitted mode is chosen Experimentally and provides growth of oriented optical fluorite single crystals.

FIG. 1 illustrates elements used in practicing the process of the invention. In FIG. 1, the furnace body 1 contains a graphite crucible 2 with a crystallizing substance 3. A seed crystal unit 4 containing inside a seed crystal 5 is placed at the bottom of the crucible. The top part of the unit and seed crystal is located inside the crucible 2 in the central part of bottom at height h1. The whole height of the seed crystal is marked as H. The crucible 2 with a seed unit 4 is put on a rod 6. The furnace has the top melt zone 7 with a heater 8 and a bottom annealing zone 9 with a heater 10. Zones 7 and 9 are divided by diaphragm 11. In FIG. 1 the part of a design connected to accommodation of a seed specially stand out for best perception of essential signs of a method. The following is a specific illustration of the method A crucible 2 with the fluorite crumb 3 loaded in it is initially put in the top zone 7 of the growth installation (see FIG. 1) for growing optical fluorite single crystals having a cylindrical shape with diameter 270 mm and height 60 mm. A seed unit 4 with a cylindrical shaped seed crystal 5 is put in the central part of a crucible bottom 2. The crucible bottom 2 has thickness of 20 mm. The height H of the seed crystal is 90 mm and its diameter is 15 mm. The top part of a seed crystal 4 is inside the crucible 2 at height h1, equaling 18 mm that makes 20% from its total height H. The crystallization process begins with melt of charge 3 by power regulation of heater 8. The melt temperature rises up to 1500° C. and the melt is held at this temperature for 40 hours, which provides full melt homogenization and purification from inclusions and bubbles. During this period a part of seed 5, which is inside the crucible, is also melting. After holding, the crucible rises to a level h2, which is 30% of the height of seed crystal H. The speed at which the height is raised is 30 mm/hr. Thus, the time of raising from h1 to h2 is 54 minutes. The crucible 2 is maintained in the raised position for 15 minutes. Melting of upper part a seed on 30% of its height occurs during this time and as a result a new crystallization center inside a seed body on border with a melt is formed. The crucible 2 with a melt 3 from a melt zone 7 is then lowered into the annealing zone 9 at a speed 0.7–2.5 mm/hr. After lowering the crucible to below the diaphragm 4 level, cooling begins under the following program that the temperature of the top and bottom heaters 5 and 6 is decreased such that the cooling of substance in the temperature interval 1500–1250° C. occurs at a rate 7–5° C./hr; in the temperature interval 1250–1100° C. at a rate of 5–2° C./hr, in the temperature interval 1100–700° C. at a rate of 1.3–2.0° C./hr, in the temperature interval 700–400° C. at a rate 0f 3.5–7.0° C./hr, and in the temperature interval 400–100° C. at a rate 10–15° C./hr; and then the furnace is cooled up to room temperature naturally.

As a result of application of the described technology for growing optical fluorite single crystals, results are crystals with optical homogeneity not worse than $2 \times 10^{-6}$ and birefringence about 1 nm/cm at the deviation from the given orientation at all area of crystal no more than 2 degrees.

Prior to the use of applicants' procedure of additional melting of the upper part a seed crystal immediately before the beginning of crystallization by the crucible rising with the seed crystal from 10–40% of its height, the crystals had the orientation distinguished on 30 degrees from a seed orientation (111).

The foregoing examples of specific compositions, processes, articles and/or apparatus employed in the practice of the present invention are, or course, intended to be illustrative rather than limiting, and it will be apparent that numerous variations and modifications of these specific embodiments may be practiced within the scope of the specification, drawing and appended claims.

What is claimed is:

1. A process for growing optical fluorite crystals, said process comprising:
   (a) having a furnace having a melting zone and an annealing zone;
   (b) placing in the furnace a crucible having
       (i) a seed crystal unit in the bottom thereof with a seed crystal in said unit, and
       (ii) a fluorite material to be melted,
   wherein said crucible and seed crystal unit are placed in the furnace such that the fluorite material to be melted is in the melting zone, and a top portion of the seed crystal within the seed unit is within the melting zone;
   (c) holding the crucible as described in step (b) in the melting zone for a time for the melt to become homogeneous;
   (e) moving the crucible and seed crystal unit in a direction such that 10–40% of the seed crystal extends into the melting zone;
   (f) holding the moved crucible and seed crystal unit in the melting zone for a dime in the range of 10–20 minutes;
   (g) moving said crucible and seed crystal unit from the melting zone to the annealing zone; and
   (h) lowering the temperature in a programmed manner to room temperature.

2. The method according to claim 1, wherein in step (c) the crucible is held in the melting zone for a time in the range of 24–48 hours.

3. The method according to claim 1, wherein in step (d) the crucible and seed crystal unit are moved into the melting zone at a rate of 5–50 mm/hour.

4. The method according to claim 1, wherein in step (g) the crucible and seed crystal unit are moved from the melting zone to the annealing zone at a rate in the range of 0.7–2.5 mm/hour.

5. The method according to claim 1, wherein melt temperature is 1500° C.

6. The method according to claim 4, wherein the programmed rate of cooling comprises cooling:
(a) from 1500 to 1250° C. at a rate of 7–5° C./hour;
(b) from 1250–1100° C. at a rate of 5–2° C./hour;
(c) from 1100–700° C. at a rate of 1.3–2.0° C./hour;
(d) from 700–400° C. at a rate of 3.5–7.0° C./hour;
(e) from 400–100° C. at a rate of 10–15° C./hour; and
(f) from 100° C. to room temperature naturally.

7. The method according to claim 1, wherein the melting zone and the annealing zone are separated by a diaphragm and the crucible is cooled to room temperature at a programmed rate after it passes the diaphragm into the annealing zone.

8. The method according to claim 8, wherein the programmed rate of cooling comprises cooling:
(a) from 1500 to 1250° C. at a rate of 7–5° C./hour;
(b) from 1250–1100° C. at a rate of 5–2° C./hour;
(c) from 1100–700° C. at a rate of 1.3–2.0° C./hour;
(d) from 700–400° C. at a rate of 3.5–7.0° C./hour;
(e) from 400–100° C. at a rate of 10–15° C./hour; and
(f) from 100° C. to room temperature naturally.

* * * * *